(12) United States Patent
Desai et al.

(10) Patent No.: US 9,250,262 B1
(45) Date of Patent: Feb. 2, 2016

(54) METHOD AND APPARATUS FOR AN INTEGRATED ISOLATION MECHANICAL FILTER WITH SUBSTRATE BASED PACKAGE

(71) Applicant: Maxim Integrated Products, Inc., San Jose, CA (US)

(72) Inventors: Hemant Desai, Gilbert, AZ (US); Viresh P. Patel, Austin, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 339 days.

(21) Appl. No.: 13/757,269

(22) Filed: Feb. 1, 2013

(51) Int. Cl.
*B81C 1/00* (2006.01)
*G01P 15/14* (2013.01)

(52) U.S. Cl.
CPC .. *G01P 15/14* (2013.01); *B81C 1/00* (2013.01)

(58) Field of Classification Search
CPC .............................. B81B 7/0058; G01D 11/10
See application file for complete search history.

(56) References Cited

U.S. PATENT DOCUMENTS

| | | | |
|---|---|---|---|
| 6,435,028 B1* | 8/2002 | Nagahara | 73/514.01 |
| 2006/0049497 A1* | 3/2006 | Ohta | 257/678 |
| 2010/0242605 A1* | 9/2010 | Offterdinger | 73/514.38 |

FOREIGN PATENT DOCUMENTS

DE        102010000848      *   7/2011

* cited by examiner

*Primary Examiner* — Eric S McCall
*Assistant Examiner* — Anthony W Megna Fuentes
(74) *Attorney, Agent, or Firm* — North Weber & Baugh LLP

(57) ABSTRACT

This invention relates generally to semiconductor manufacturing and packaging and more specifically to semiconductor manufacturing in MEMS (Microelectromechanical systems) inertial sensing products. Embodiments of the present invention provide a robust packaging process and a mechanical filter to reduce the mechanical shock from impact. The mechanical filter can be integrated within the package substrate as part of the packaging process, reducing the assembly complexity.

10 Claims, 3 Drawing Sheets

METHOD AND APPARATUS FOR AN INTEGRATED ISOLATION MECHANICAL FILTER WITH SUBSTRATE BASED PACKAGE

BACKGROUND

A. Technical Field

This invention relates generally to semiconductor manufacturing and packaging and more specifically to semiconductor manufacturing in MEMS (Microelectromechanical systems) sensing products.

B. Background of the Invention

MEMS sensing products can fail as a result of stresses and external mechanical shock such as rock impingement. For critical applications this can have catastrophic consequences. One field for which the consequences are catastrophic is in the field of automotive stability control, automotive air bag systems is another field and engine pressure management is yet another field for which consequences are catastrophic.

Automobiles use an inertial sensing device or a gyroscope device to assist in stability control and roll-over detection. The proper operation of the gyroscopic device is critical to the safety of the passengers of the automobile in order to detect a potentially dangerous condition, such as loss of control or roll-over. The gyroscope device normally is under a car within a housing. The location of the gyroscope device makes it particularly prone to impact by debris from the road. Even within the housing a rock, pebble or other road debris can impact the housing of the gyroscopic device and impair its operation.

Under normal conditions, the gyroscope has a drive mass that operates at a high frequency (typically approximately 10-50 KHz). The control of this frequency is critical in achieving the sensitivity specification and therefore this frequency is controlled by a closed loop system. When a pebble or rock strikes the gyroscope housing, it may generate a shock frequency that is at a resonant mode of the gyroscope system. This impact will then cause the drive mass to touch the substrate resulting in a loss of lock on the drive signal. This impact causes a brief failure of the gyroscope device. However, that brief failure can occur at a critical time and by the time the gyroscope device has recovered the vehicle could have already rolled over.

Unfortunately, the functioning of the gyroscope device is even more critical on road surfaces with a lot of debris, for example a dirt road or a road covered in pebbles. On those types of surfaces there are more likely to be stability control or roll-over issues. Also, those surfaces are more prone to impact and thus failure of the gyroscope device.

In summary, what is needed is a way to prevent the gyroscope device from failing due to impact.

SUMMARY OF THE INVENTION

Embodiments of the present invention provide a robust packaging process and a mechanical filter to reduce the mechanical shock from impact. The mechanical filter can be integrated within the package substrate as part of the packaging process, reducing the assembly complexity.

In one embodiment, a mechanical filter is formed by surrounding a MEMS device with a trench. The trench acts as a mechanical filter or a spring allowing the MEMS device to move. Therefore, the shock of the impact is absorbed by the mechanical filter. The trench also can have a recess allowing space for the MEMS device to move. In one embodiment, the trench is formed as part of the same process as making the MEMS device.

Other objects and attainments together with a fuller understanding of the invention will become apparent and appreciated by referring to the following description and claims taken in conjunction with the accompanying drawings.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

The following description is set forth for purpose of explanation in order to provide an understanding of the invention. However, it is apparent that one skilled in the art will recognize that embodiments of the present invention, some of which are described below, may be incorporated into a number of different systems and devices. The embodiments of the present invention may be present in hardware, software or firmware. Structures shown below in the diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
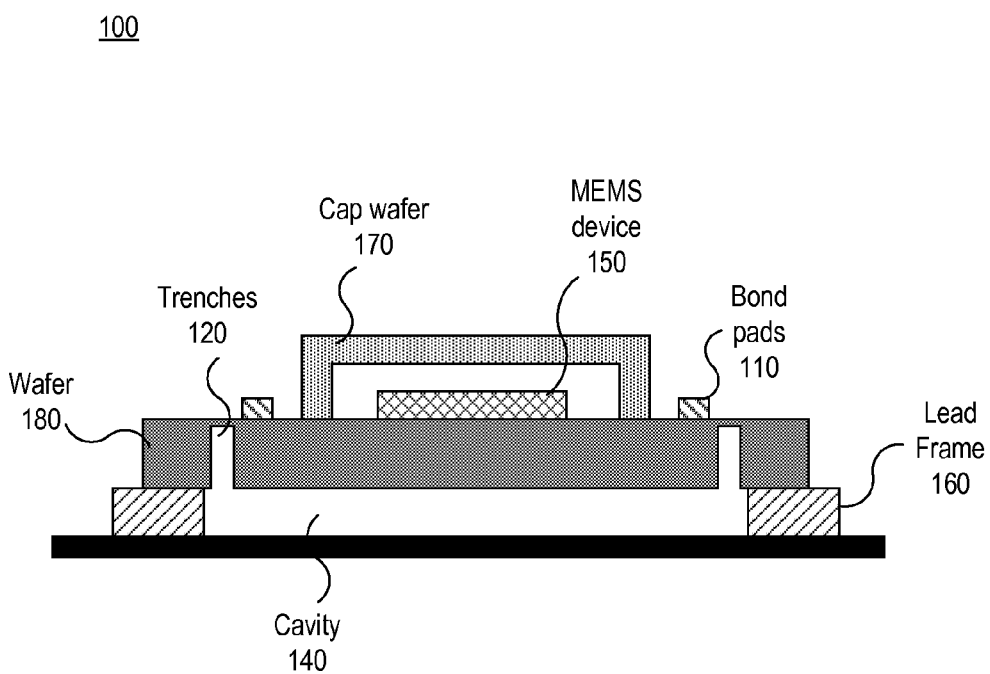
FIG. 1 shows a cross sectional view of a package before molding, in accordance with various aspects of the present invention.

FIG. 1 shows a cross sectional view of a package 100 before molding, in accordance with various aspects of the present invention. FIG. 1 shows the MEMS device 150. Surrounding the MEMS device 150 is trench 120. Trench 120 provides mechanical isolation for the MEMS device 150. Trench 120 is integrated into the MEMS device 150 during the manufacturing process. Also shown in FIG. 1 is the lead frame 160 and the recess or cavity 140 in the lead frame. The recess 140 permits the MEMS device 150 to move and the mechanical isolation formed by the trench 120 to function. The MEMS device 150 is attached to the wafer 180.

FIG. 1 shows bond pads 110. Bond pads 110 illustrate one advantage of the present invention that the bond pads are placed in the die attach region or the stable region of the die. Thus, wire fatigue problems are reduced and manufacturing yield is increased. FIG. 1 also shows cap wafer 170.

The trench 120 provides mechanical isolation for a MEMS device. In the example of an automobile and an inertial sensing device, the mechanical isolation can prevent failure of the inertial sensing device caused by shock of impact from road debris.

Figure 2:
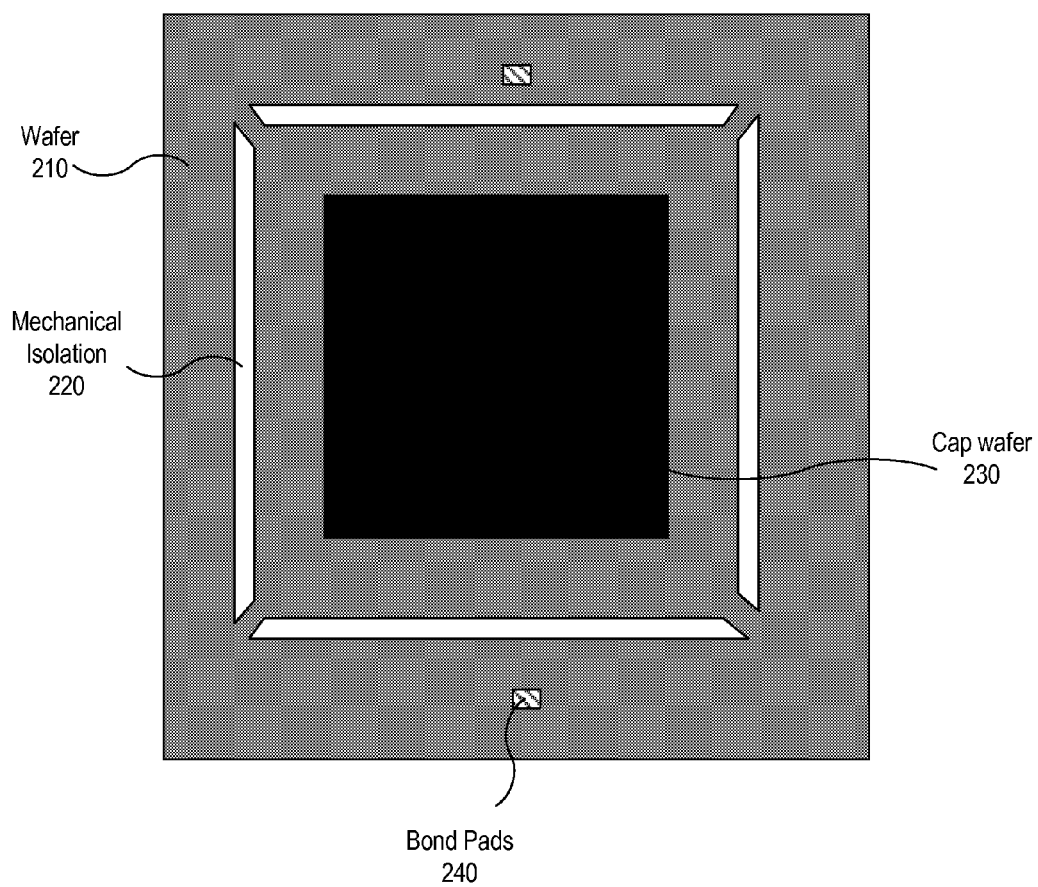
FIG. 2 shows a top view a package before molding, in accordance with various aspects of the present invention.

FIG. 2 shows a top view a package before molding, in accordance with various aspects of the present invention. FIG. 2 shows device wafer 210, mechanical isolation 220, cap 230, and bond pads 240. The mechanical isolation 220 shown is for illustration only. It can be of any shape or size. In one embodiment, mechanical isolation 220 is helical in shape. In another embodiment, mechanical isolation 220 is square in shape. Mechanical isolation 220 is designed to act as a mechanical spring. The mechanical spring is designed to have a particular size, shape and spring constant such that the shock impact at the resonant frequency of the MEMS device is reduced enough for the MEMS device to function.

Also, shown in FIG. 2 are the bond pads. In one embodiment, the bond pads 240 are attached to the wafer 210 in the region outside the spring. The recess allows the spring to function and gives it room to move to perform its function of mechanical isolation.

One advantage of the present invention is the ability to manufacture the present invention without damaging the filter and with high yield rates. A further advantage of the present invention is that the mechanical filter can be implemented with relatively low cost. Yet a further advantage of the present invention is the mechanical isolation provided.

Figure 3:
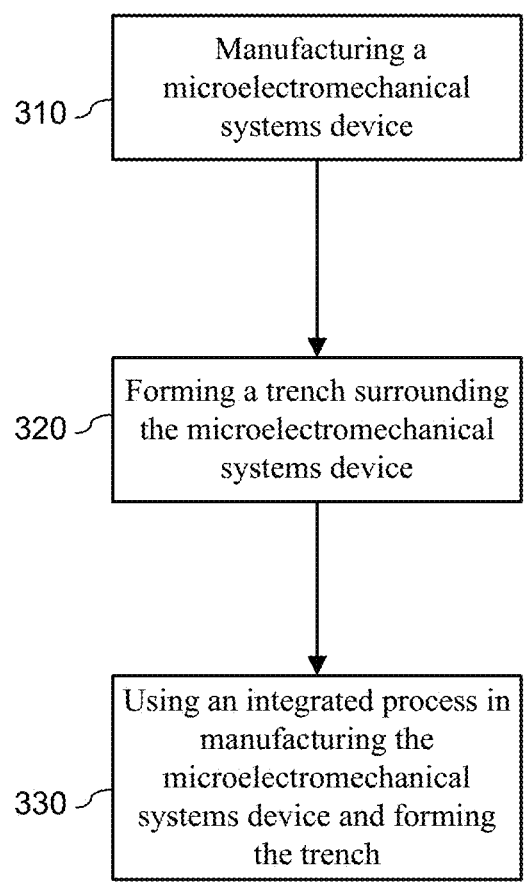
FIG. 3 shows a flowchart for a method of manufacture, in accordance with various aspects of the present invention.

FIG. 3 shows a flowchart for a method of manufacture, in accordance with various aspects of the present invention. The method of manufacture involves manufacturing a MEMS device 310, forming a trench surrounding the MEMS device 320, and using an integrated process in manufacturing the MEMS device and forming the trench 330. Using an integrated manufacture process integrates the mechanical filter in the MEMS device. Thus, improved manufacturing yield is provided and wire fatigue is reduced.

In the embodiment where the MEMS device is a gyroscope on an automobile, the integrated mechanical filter permits the gyroscope to continue to operate even under conditions caused by shock impact as a result of being hit by a rock or pebble on the road. This is a tremendous advantage since without the integrated mechanical filter the gyroscope could fail at the time when it is needed the most to prevent roll over or stability control.

Integrating the manufacture of the MEMS device and the mechanical isolation device also provides the added benefit of reduced wire fatigue since the bond pads can be placed outside the mechanical isolation device.

Another advantage of integrating the manufacturing process is that the present invention can be implemented with relatively low cost. The above benefits can be achieved without adding a lot of cost either in cost per unit or in reduction of manufacture yield to the manufacturing process.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications, combinations, permutations, and variations as may fall within the spirit and scope of the appended claims.

What is claimed is:

1. An apparatus for filtering mechanical stress, comprising:
   a microelectromechanical systems device;
   a wafer attached to the microelectromechanical systems device, a portion of the wafer being removed to form a trench surrounding the microelectromechanical systems device; and
   a lead frame attached to the wafer and having a cavity formed at least partially beneath the wafer, the trench and cavity forming an integral empty space.

2. The apparatus of claim 1, wherein the microelectromechanical systems device is an inertial sensing device.

3. The apparatus of claim 2, wherein the inertial sensing device is a gyroscope.

4. The apparatus of claim 3, wherein the gyroscope is used for stability control on an automobile.

5. The apparatus of claim 1, wherein the trench is configured to isolate a microelectromechanical systems device from mechanical stress to thereby function as a mechanical filter.

6. The apparatus of claim 5, wherein the mechanical filter is designed to reduce effects of shock impact at a resonant frequency of the microelectromechanical systems device.

7. The apparatus of claim 1, wherein the trench is round in shape.

8. The apparatus of claim 1, wherein the trench is square in shape.

9. An apparatus for mechanical isolation comprising:
   a microelectromechanical systems device;
   a wafer attached to the microelectromechanical systems device, a portion of the wafer being removed to form a trench that surrounds the microelectromechanical systems device and acts as a mechanical filer that isolates mechanical stress;
   a lead frame attached to the wafer and having a cavity formed at least partially beneath the wafer, the trench and cavity forming an integral empty space; and
   a cap wafer disposed over the microelectromechanical systems device.

10. The apparatus of claim 9, wherein the microelectromechanical systems device is a gyroscope.

* * * * *